United States Patent
Kimura et al.

(10) Patent No.: US 11,075,262 B2
(45) Date of Patent: Jul. 27, 2021

(54) SEMICONDUCTOR DEVICE

(71) Applicant: KABUSHIKI KAISHA TOSHIBA, Minato-ku (JP)

(72) Inventors: Shigeya Kimura, Yokohama (JP); Hisashi Yoshida, Kawasaki (JP); Tatsuo Shimizu, Shinagawa (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 57 days.

(21) Appl. No.: 16/568,490

(22) Filed: Sep. 12, 2019

(65) Prior Publication Data
US 2020/0185492 A1   Jun. 11, 2020

(30) Foreign Application Priority Data
Dec. 10, 2018 (JP) .............................. JP2018-230703

(51) Int. Cl.
*H01L 29/66* (2006.01)
*H01L 29/04* (2006.01)
(Continued)

(52) U.S. Cl.
CPC .......... *H01L 29/045* (2013.01); *H01L 29/165* (2013.01); *H01L 29/1608* (2013.01); *H01L 29/66431* (2013.01); *H01L 29/778* (2013.01)

(58) Field of Classification Search
CPC ... H01L 29/15–158; H01L 29/122–127; H01L 2924/13064; H01L 29/778–7789; H01L 29/66462; H01L 29/66431
See application file for complete search history.

(56) References Cited

U.S. PATENT DOCUMENTS 9,601,610 B1 * 3/2017 Khalil ................. H01L 29/7789
2015/0014700 A1 * 1/2015 Khalil ................. H01L 29/7788
                                                                257/76
(Continued)

FOREIGN PATENT DOCUMENTS

JP        2007-103727 A    4/2007
JP         5207874 B2       6/2013
(Continued)

OTHER PUBLICATIONS

Shen, Z. et al., "Prediction of High-Density and High-Mobility Two-Dimensional Electron Gas at $Al_xGa_{1-x}N$/4H-SiC Interface," Materials Science Forum, vol. 897, pp. 719-722.

(Continued)

*Primary Examiner* — Jarrett J Stark
(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a semiconductor member, and a first crystal member. A direction from the first electrode toward the second electrode is aligned with a first direction. A position in the first direction of the third electrode is between positions in the first direction of the first electrode and the second electrode. The semiconductor member includes at least one selected from the group consisting of silicon carbide, silicon, carbon, and germanium. The semiconductor member includes a first region, and first and second partial regions. The first region is between the first and second electrodes in the first direction. A second direction from the first region toward the third electrode crosses the first direction. The first crystal member is provided between the first and third electrodes in the second direction.

20 Claims, 7 Drawing Sheets

(51) Int. Cl.
*H01L 29/165* (2006.01)
*H01L 29/16* (2006.01)
*H01L 29/778* (2006.01)

(56) References Cited

U.S. PATENT DOCUMENTS

| | | |
|---|---|---|
| 2016/0079410 A1 | 3/2016 | Yasumoto et al. |
| 2017/0117398 A1* | 4/2017 | Xiao ................. H01L 29/66462 |
| 2019/0348503 A1 | 11/2019 | Kimura et al. |
| 2019/0348531 A1 | 11/2019 | Kimura et al. |
| 2020/0185492 A1* | 6/2020 | Kimura ................. H01L 29/778 |
| 2021/0028303 A1* | 1/2021 | Suzuki ................. H01L 29/7786 |

FOREIGN PATENT DOCUMENTS

| | | |
|---|---|---|
| JP | 2016-58648 A | 4/2016 |
| JP | 2019-201035 A | 11/2019 |
| JP | 2019-201036 A | 11/2019 |

OTHER PUBLICATIONS

Onojima, N. et al., "Molecular-beam epitaxy of AlN on off-oriented SiC and demonstration of MISFET using AlN/SiC interface," Physica Status Solidi (c), vol. 2, No. 7, pp. 2643-2646.

* cited by examiner

SEMICONDUCTOR DEVICE

CROSS-REFERENCE TO RELATED APPLICATIONS

This application is based upon and claims the benefit of priority from Japanese Patent Application No. 2018-230703, filed on Dec. 10, 2018; the entire contents of which are incorporated herein by reference.

FIELD

Embodiments described herein relate generally to a semiconductor device.

BACKGROUND

It is desirable to improve the characteristics of a semiconductor device.

DETAILED DESCRIPTION

According to one embodiment, a semiconductor device includes a first electrode, a second electrode, a third electrode, a semiconductor member, and a first crystal member. A direction from the first electrode toward the second electrode is aligned with a first direction. A position in the first direction of the third electrode is between a position in the first direction of the first electrode and a position in the first direction of the second electrode. The semiconductor member includes at least one selected from the group consisting of silicon carbide, silicon, carbon, and germanium. The semiconductor member includes a first region, a first partial region, and a second partial region. The first region is between the first electrode and the second electrode in the first direction. A second direction from the first region toward the third electrode crosses the first direction. The first partial region is between the first electrode and the first region in the first direction. A direction from the first partial region toward the second partial region is aligned with the second direction. The second partial region is between the first electrode and the third electrode in the first direction. The first crystal member is provided between the first region and the third electrode in the second direction.

According to another embodiment, a semiconductor device includes a first electrode, a second electrode, a third electrode, a fourth electrode, a fifth electrode, a semiconductor member, a first crystal member, and a second crystal member. A direction from the first electrode toward the second electrode is aligned with a first direction. A position in the first direction of the third electrode is between a position in the first direction of the first electrode and a position in the first direction of the second electrode. A direction from the first electrode toward the fourth electrode is aligned with the first direction. A direction from the second electrode toward the fourth electrode is aligned with a second direction crossing the first direction. A position in the first direction of the fifth electrode is between the position in the first direction of the first electrode and a position in the first direction of the fourth electrode. A direction from the third electrode toward the fifth electrode is aligned with the second direction. The semiconductor member includes at least one selected from the group consisting of silicon carbide, silicon, carbon, and germanium. The semiconductor member includes a first region and a second region. The first region is between the first electrode and the second electrode in the first direction. The second region is between the first electrode and the fourth electrode in the first direction. The first crystal member is provided between the first region and the third electrode in the second direction. The second crystal member is provided between the second region and the fifth electrode in the second direction.

According to another embodiment, a semiconductor device includes a first electrode, a second electrode, a third electrode, a fourth electrode, a semiconductor member, a first crystal member, and a second crystal member. A first direction from the third electrode toward the fourth electrode crosses a second direction from the first electrode toward the second electrode. A position in the second direction of the third electrode is between a position in the second direction of the first electrode and a position in the second direction of the second electrode. The semiconductor member includes at least one selected from the group consisting of silicon carbide, silicon, carbon, and germanium. The semiconductor member includes a first region and a second region. The first region is between the first electrode and the third electrode in the second direction. The second region is between the third electrode and the second electrode in the second direction. The first region and the second region is electrically connected to the fourth electrode. The first crystal member is provided between the first region and the third electrode in the second direction. The second crystal member is provided between the second region and the third electrode in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
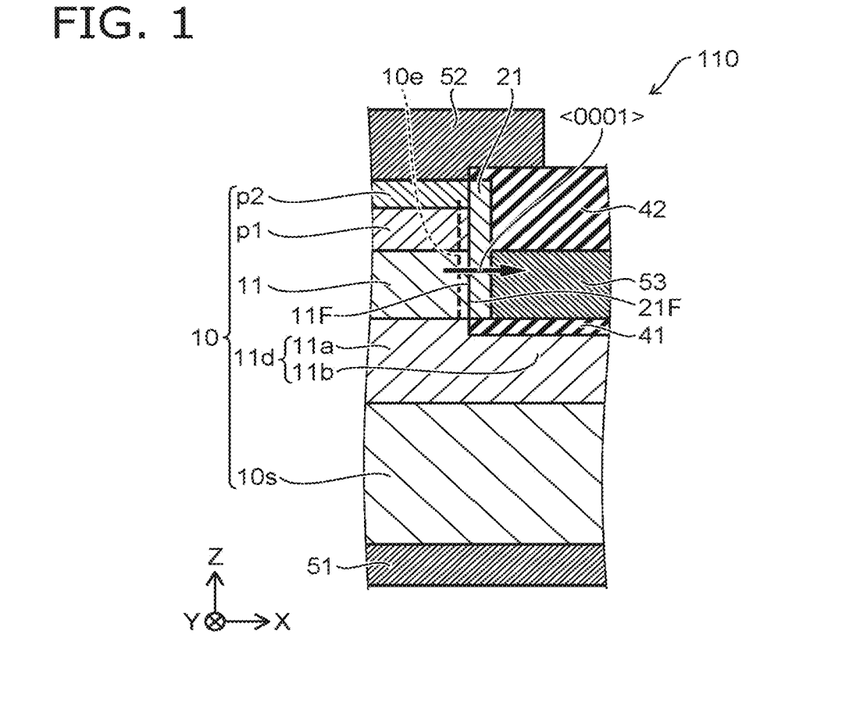
FIG. 1 is a schematic cross-sectional view illustrating a semiconductor device according to a first embodiment.

FIG. 1 is a schematic cross-sectional view illustrating a semiconductor device according to a first embodiment.

As shown in FIG. 1, the semiconductor device 110 according to the first embodiment includes a first electrode 51, a second electrode 52, a third electrode 53, a semiconductor member 10, and a first crystal member 21.

The direction from the first electrode 51 toward the second electrode 52 is aligned with a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The position in the first direction (the Z-axis direction) of the third electrode 53 is between the position in the first direction of the first electrode 51 and the position in the first direction of the second electrode 52. For example, at least a portion of the third electrode 53 in the Z-axis direction may be between at least a portion of the first electrode 51 and at least a portion of the second electrode 52.

The semiconductor member 10 includes, for example, at least one selected from the group consisting of silicon carbide, silicon, carbon, and germanium.

The semiconductor member includes a first region 11, a first partial region 11a, and a second partial region 11b.

The first region 11 is between the first electrode 51 and the second electrode 52 in the first direction (the Z-axis direction). A second direction from the first region 11 toward the third electrode 53 crosses the first direction (the Z-axis direction). The second direction is, for example, the X-axis direction.

The first partial region 11a is between the first electrode 51 and the first region 11 in the first direction (the Z-axis direction). The direction from the first partial region 11a toward the second partial region 11b is aligned with the second direction (the X-axis direction). The second partial region 11b is between the first electrode 51 and the third electrode 53 in the first direction (the Z-axis direction).

The first crystal member 21 is provided between the first region 11 and the third electrode 53 in the second direction (e.g., the X-axis direction).

In the example, the semiconductor member 10 further includes a substrate 10s. The substrate 10s is provided between the first electrode 51 and the first partial region 11a and between the first electrode 51 and the second partial region 11b. The substrate 10s is, for example, a SiC substrate. The substrate 10s includes, for example, 4H-SiC or 6H-SiC.

For example, a trench is formed in the semiconductor member 10 including the substrate 10s; and the first crystal member 21 and the third electrode 53 are provided inside the trench. For example, the first crystal member 21 is formed on the side surface of the trench. The third electrode 53 is formed in at least a portion of the remaining space.

The first crystal member 21 has a polarization. In one example, the first crystal member 21 has a wurtzite structure. In another example, the first crystal member 21 has another crystal structure having a polarization.

For example, based on the polarization of the first crystal member 21, a carrier region (in the example of FIG. 1, a two-dimensional electron gas 10e) is generated in the semiconductor member 10.

For example, the first electrode 51 functions as a drain electrode. For example, the second electrode 52 functions as a source electrode. For example, the third electrode 53 functions as a gate electrode. The semiconductor device 110 is, for example, a transistor (e.g., a HEMT (high electron mobility transistor)).

For example, the current that flows between the first electrode 51 and the second electrode 52 can be controlled by the voltage applied to the third electrode 53. The first region 11 is a portion of a current path.

In the embodiment, in addition to the first region 11 opposing the third electrode 53 in the X-axis direction, the semiconductor member 10 includes a region (the second partial region 11b) between the third electrode 53 and the first electrode 51 in the Z-axis direction. The first partial region 11a is provided to connect the first region 11 and the second partial region 11b. Therefore, the first partial region 11a and the second partial region 11b function as a current path. In the second partial region 11b, the current flows while spreading in the X-axis direction. For example, the cross-sectional area of the current path is enlarged. The ON-resistance can be reduced thereby. According to the embodiment, a semiconductor device can be provided in which the characteristics can be improved. An example of the characteristics of the semiconductor device 110 is described below.

In the example of FIG. 1, the first crystal member 21 has a wurtzite structure. The first crystal member includes, for example, $Al_xGa_{1-x}N$ ($0<x\leq1$). The first crystal member is, for example, AlN, AlGaN, etc.

In the example of FIG. 1, the <0001> direction of the first crystal member 21 is aligned with the second direction (e.g., the X-axis direction). For example, the absolute value of the angle between the <0001> direction and the Z-axis direction exceeds 45 degrees. As described below, the <000-1> direction of the first crystal member 21 may be aligned with the second direction (e.g., the X-axis direction).

The "−" in the description of the crystal orientation of this specification denotes a bar. For example, "−1" corresponds to "1" with a bar.

For example, the <0001> direction of the first crystal member 21 has a component in the orientation from the first region 11 toward the third electrode 53. In such a case, the two-dimensional electron gas 10e is generated as a carrier region in the region of the semiconductor member 10 at the vicinity of the third electrode 53.

The first crystal member 21 may have a crystal structure other than a wurtzite structure. The first crystal member 21 includes, for example, at least one selected from the group consisting of $BaTiO_3$, $PbTiO_3$, $Pb(Zr_x, Ti_{1-x})O_3$, $KNbO_3$, $LiNbO_3$, $LiTaO_3$, $Na_xWO_3$, $ZnO$, $Ba_2NaNb_5O_5$, $Pb_2KNb_5O_{15}$, and $Li_2B_4O_7$. For example, the orientation from negative to positive of the polarization of the first crystal member 21 or the orientation from positive to negative of the polarization is aligned with the second direction (the X-axis direction). An example will now be described in which the first crystal member 21 has a wurtzite structure.

In the semiconductor device 110 as shown in FIG. 1, the semiconductor member 10 may include a first portion p1 and a second portion p2. The first portion p1 is provided between the first region 11 and the second electrode 52 in the first direction (the Z-axis direction). The second portion p2 is provided between the first portion p1 and the second electrode 52 in the first direction (the Z-axis direction). The impurity concentration of the second portion p2 is higher than the impurity concentration of the first portion p1.

For example, the second portion p2 functions as a contact region with the second electrode 52. In the example, the conductivity type of the second portion p2 is an n-type.

When the <0001> direction of the first crystal member 21 has a component in the orientation from the first region 11 toward the third electrode 53 (referring to FIG. 1), it is favorable for the first region 11 to be of a p-type. Thereby, for example, the threshold voltage can be increased. For example, a normally-OFF operation is obtained.

It is favorable for the impurity concentration of the first portion p1 between the first region 11 and the second portion p2 to be lower than that of the first region 11 and lower than that of the second portion p2. Thereby, for example, the OFF-current (e.g., the leakage current) can be suppressed.

On the other hand, the conductivity type of the substrate 10s is the reverse of the conductivity type of the first region 11. In the example, the first region 11 is of the p-type; the second portion p2 is of the $n^+$-type; and the substrate 10s is of the $n^+$-type.

For example, the first partial region 11a and the second partial region 11b function as a drift region 11d. The impurity concentrations of the first partial region 11a and the second partial region 11b are lower than the impurity concentration in the first region 11.

The first partial region 11a and the second partial region 11b include, for example, 4H-SiC or 6H-SiC. The semiconductor member 10 includes, for example, 4H-SiC or 6H-SiC.

A first insulating member 41 is provided in the semiconductor device 110. The first insulating member 41 is provided between the second partial region 11b and the third electrode 53. The first insulating member 41 electrically insulates the third electrode 53 and the semiconductor member 10 (the second partial region 11b, etc.). As described below, the first insulating member 41 may be omitted.

In the example of FIG. 1, the semiconductor device 110 further includes a second insulating member 42. The second insulating member 42 is provided between the third electrode 53 and a portion of the second electrode 52 in the first direction (the Z-axis direction). The second insulating member 42 electrically insulates the second electrode 52 and the third electrode 53.

As shown in FIG. 1, the first region 11 has a surface 11F. The surface 11F opposes the first crystal member 21. The first crystal member 21 has a first surface 21F. The first surface 21F opposes the first region 11. For example, the first surface 21F contacts the surface 11F. The first surface 21F is aligned with the first direction (the Z-axis direction).

When the first crystal member 21 has a wurtzite structure, for example, the first surface 21F is along the c-plane. The first surface 21F may be substantially parallel to the c-plane. The angle between the first surface 21F and the c-plane is, for example, less than 45 degrees. The angle between the first surface 21F and the c-plane is, for example, 10 degrees or less. For example, the front surface of the substrate 10s (which may be, for example, the surface on the first electrode 51 side) may be along the a-plane or the m-plane.

Figure 2:
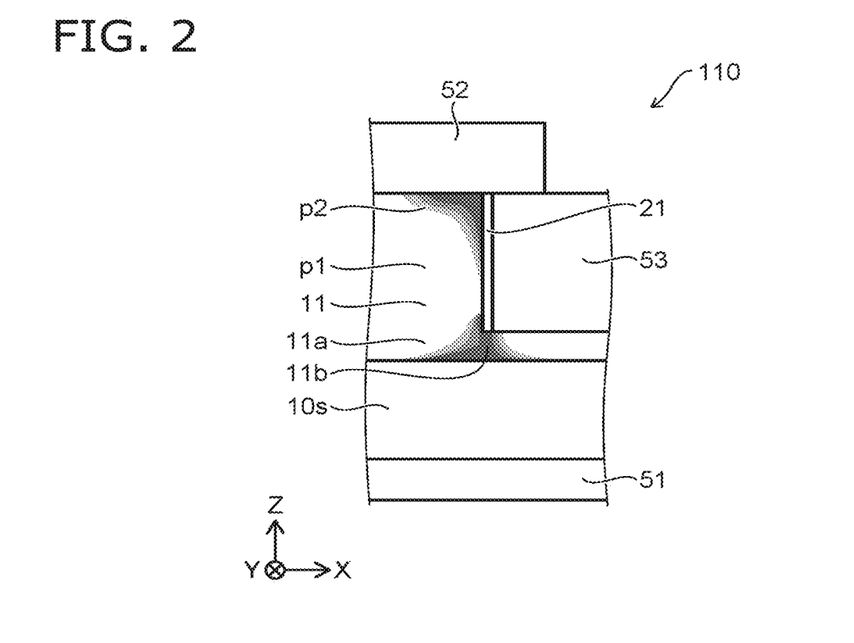
FIG. 2 is a schematic view illustrating characteristics of the semiconductor device according to the first embodiment.

FIG. 2 is a schematic view illustrating characteristics of the semiconductor device according to the first embodiment.

FIG. 2 illustrates simulation results of the electron density of the semiconductor device 110 when ON. In FIG. 2, the light and dark of the image correspond to the level of the electron density. The electron density in the dark portions of the image is higher than the electron density in the light portions of the image. As shown in FIG. 2, the electron density is high in the region between the first partial region 11a and the third electrode 53. The region where the electron density is high spreads in the second partial region 11b and spreads to the lower side of the third electrode 53. In the embodiment, a region where the electron density is high is obtained by the second partial region 11b. The ON-resistance of the embodiment can be low compared to the case where the second partial region 11b is not provided.

Figure 3:
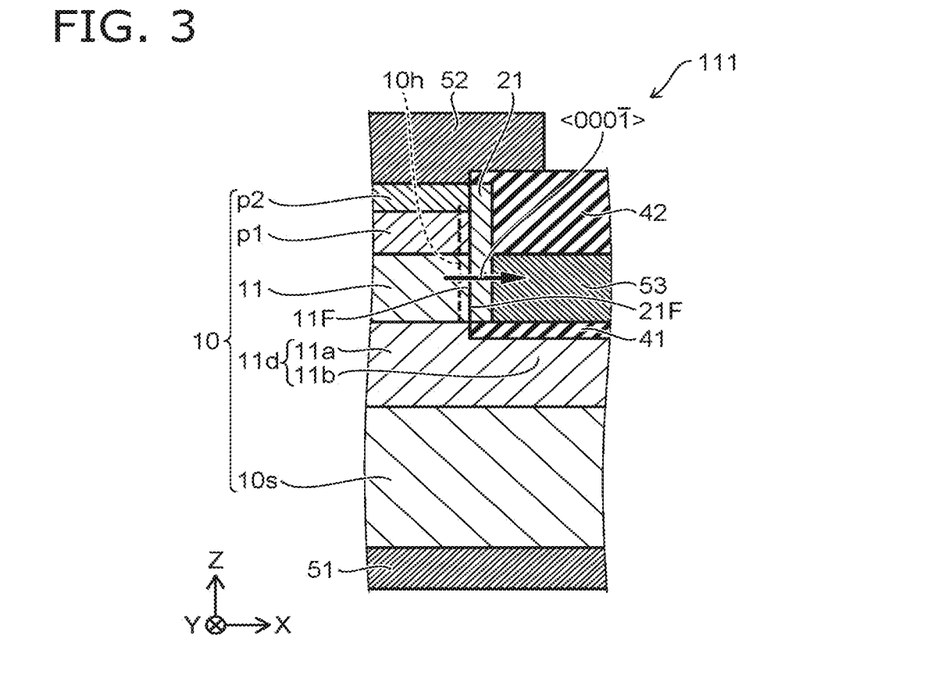
FIG. 3 is a schematic cross-sectional view illustrating a semiconductor device according to the first embodiment.

FIG. 3 is a schematic cross-sectional view illustrating a semiconductor device according to the first embodiment.

Portions of the semiconductor device 111 according to the embodiment that are different from the semiconductor device 110 will now be described. In the semiconductor device 111 as well, for example, the first crystal member 21 has a wurtzite structure. In the semiconductor device 111, the <000-1> direction of the first crystal member 21 has a component in the orientation from the first region 11 toward the third electrode 53. In such a case, a two-dimensional hole gas 10h is generated as a carrier region in the region of the semiconductor member 10 at the vicinity of the third electrode 53. In the semiconductor device 111 as well, the ON-resistance can be reduced by providing the second partial region 11b. A semiconductor device can be provided in which the characteristics can be improved.

In the semiconductor device 111, it is favorable for the first region 11 to be of the n-type. Thereby, for example, the threshold voltage can be increased. For example, a normally-OFF operation is obtained.

In one example of the semiconductor device 111, the second portion p2 is of the $p^+$-type. For example, the substrate 10s is of the $p^+$-type.

In the semiconductor device 111, the first crystal member 21 may have a crystal structure having a polarization other than a wurtzite structure. In such a case, the orientation from negative to positive of the polarization of the first crystal member 21 or the orientation from positive to negative of the polarization of the first crystal member 21 may be aligned with the second direction (the X-axis direction).

Figure 4:
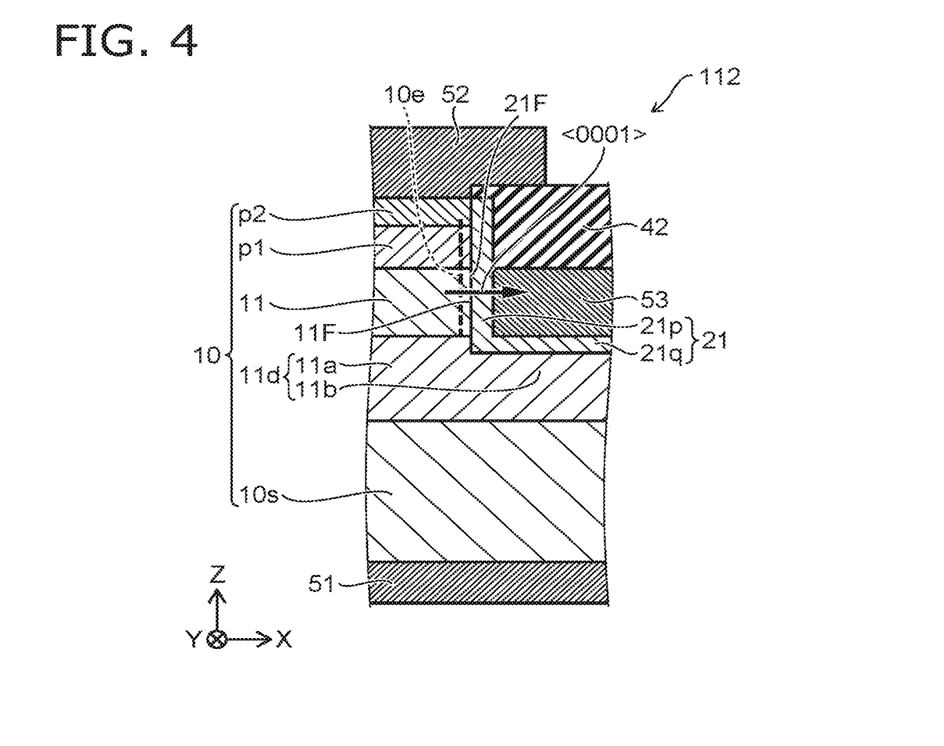
FIG. 4 is a schematic cross-sectional view illustrating a semiconductor device according to the first embodiment.

FIG. 4 is a schematic cross-sectional view illustrating a semiconductor device according to the first embodiment.

Portions of the semiconductor device 112 according to the embodiment that are different from the semiconductor device 110 will now be described. The first insulating member 41 is not provided in the semiconductor device 112. In the semiconductor device 112, the first crystal member 21 includes multiple regions (a region 21p and a region 21q). The region 21p is between the first region 11 and the third electrode 53 in the second direction (the X-axis direction). The region 21q is between the second partial region 11b and the third electrode 53 in the first direction (the Z-axis direction). The region 21q electrically insulates the second partial region 11b and the third electrode 53.

Figure 5:
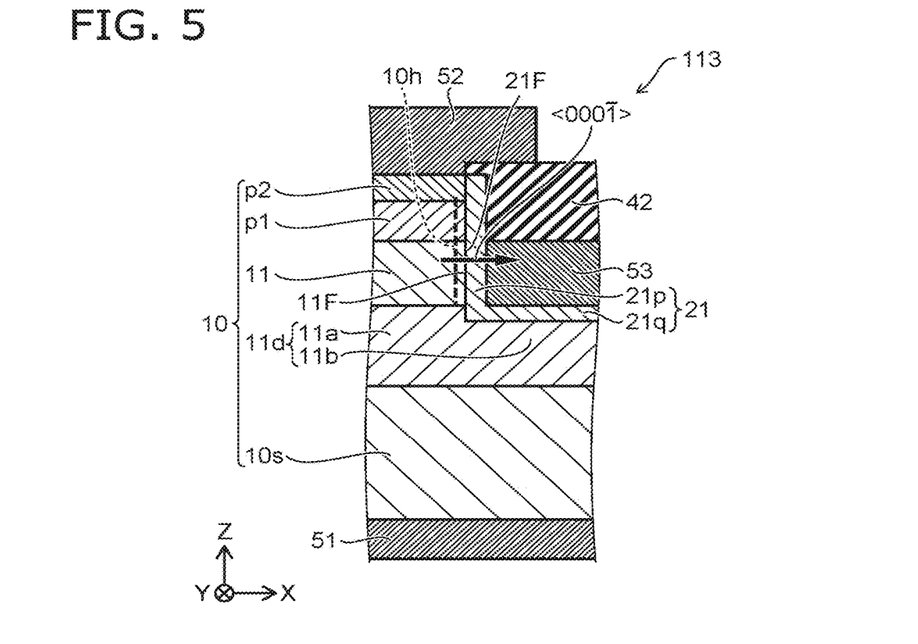
FIG. 5 is a schematic cross-sectional view illustrating a semiconductor device according to the first embodiment.

FIG. 5 is a schematic cross-sectional view illustrating a semiconductor device according to the first embodiment.

Portions of the semiconductor device 113 according to the embodiment that are different from the semiconductor device 111 will now be described. In the semiconductor device 113 as well, the first insulating member 41 is not provided. In the semiconductor device 113 as well, the first crystal member 21 includes the region 21p and the region 21q. The region 21p is between the first region 11 and the third electrode 53 in the second direction. The region 21q is between the second partial region 11b and the third electrode 53 in the first direction. The region 21q electrically insulates the second partial region 11b and the third electrode 53.

In the semiconductor devices 112 and 113 as well, the ON-resistance can be reduced. A semiconductor device can be provided in which the characteristics can be improved.

Second Embodiment

Figure 6:
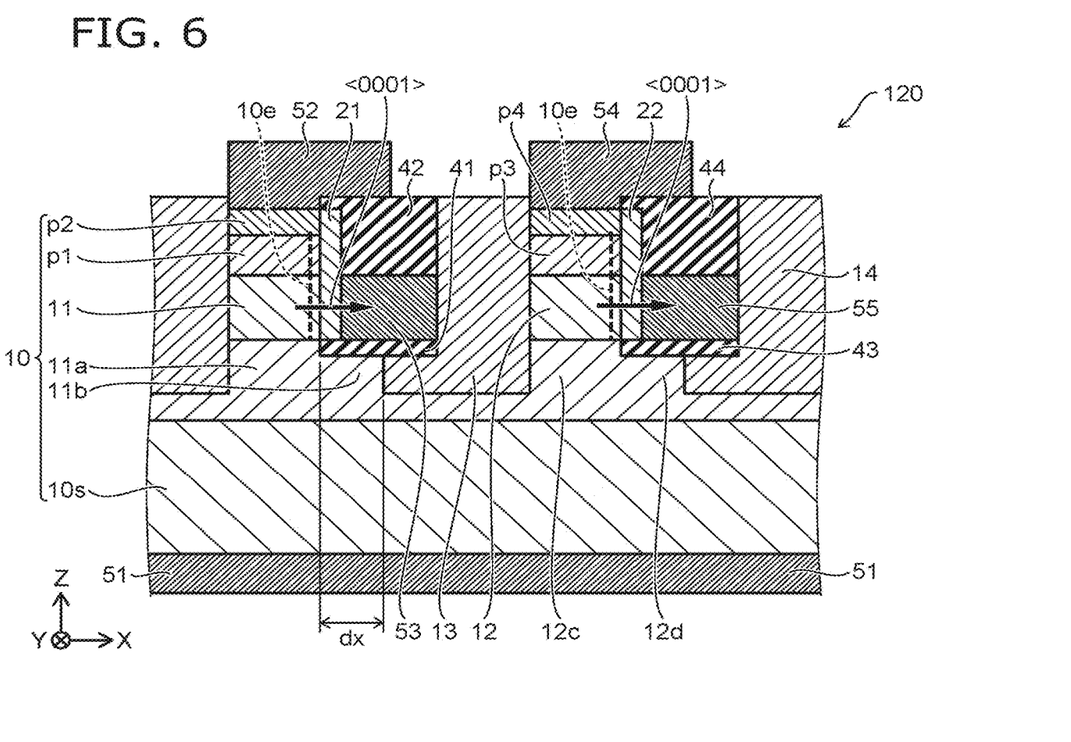
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, the semiconductor device 120 according to the second embodiment includes the first electrode 51, the second electrode 52, the third electrode 53, a fourth electrode 54, a fifth electrode 55, the semiconductor member 10, the first crystal member 21, and a second crystal member 22.

The direction from the first electrode 51 toward the second electrode 52 is aligned with the first direction. The first direction is, for example, the Z-axis direction.

The position in the first direction (the Z-axis direction) of the third electrode 53 is between the position in the first direction of the first electrode 51 and the position in the first direction of the second electrode 52.

The direction from the first electrode 51 toward the fourth electrode 54 is aligned with the first direction (the Z-axis direction). The direction from the second electrode 52 toward the fourth electrode 54 is aligned with the second direction. The second direction crosses the first direction. The second direction is, for example, the X-axis direction.

The position in the first direction (the Z-axis direction) of the fifth electrode 55 is between the position in the first direction of the first electrode 51 and the position in the first direction of the fourth electrode 54. The direction from the third electrode 53 toward the fifth electrode 55 is aligned with the second direction (e.g., the X-axis direction).

The semiconductor member 10 includes at least one selected from the group consisting of silicon carbide, silicon, carbon, and germanium. The semiconductor member 10 includes the first region 11 and a second region 12. The first region 11 is between the first electrode 51 and the second electrode 52 in the first direction (the Z-axis direction). The second region 12 is between the first electrode 51 and the fourth electrode 54 in the first direction (the Z-axis direction). For example, the direction from the first region 11 toward the second region 12 is aligned with the X-axis direction.

The first crystal member 21 is provided between the first region 11 and the third electrode 53 in the second direction (e.g., the X-axis direction). The second crystal member 22 is provided between the second region 12 and the fifth electrode 55 in the second direction.

For example, the first electrode 51 functions as a drain electrode. For example, the second electrode 52 functions as one source electrode. For example, the third electrode 53 functions as one gate electrode. For example, the fourth electrode 54 functions as another source electrode. For example, the fifth electrode 55 functions as another gate electrode. The semiconductor device 120 is, for example, a transistor (e.g., a HEMT).

In the semiconductor device 120, for example, the first crystal member 21 and the second crystal member 22 have wurtzite structures. For example, the <0001> direction or the <000-1> direction of the first crystal member is aligned with the second direction (the X-axis direction). The <0001> direction or the <000-1> direction of the second crystal member is aligned with the second direction (the X-axis direction).

In the example shown in FIG. 6, the <0001> direction of the first crystal member 21 has a component in the orientation from the first region 11 toward the third electrode 53. The <0001> direction of the second crystal member 22 has a component in the orientation from the second region 12 toward the fifth electrode 55.

In such a case, the two-dimensional electron gas 10e is generated in the region of the first region 11 opposing the third electrode 53 and the region of the second region 12 opposing the fifth electrode 55. The two-dimensional electron gas 10e functions as a current path.

In the embodiment, multiple current paths are formed in one semiconductor member 10. Large-current switching is possible thereby. For example, the ON-resistance can be reduced. According to the embodiment, a semiconductor device can be provided in which the characteristics can be improved.

For example, the first region 11 contacts the first crystal member 21. The second region 12 contacts the second crystal member 22.

In the semiconductor device 120, the first crystal member 21 and the second crystal member 22 may have crystal structures having polarizations other than a wurtzite structure. In such a case, the orientation from negative to positive of the polarization for the first crystal member 21 and the second crystal member 22 or the orientation from positive to negative of the polarization for the first crystal member 21 and the second crystal member 22 may be aligned with the second direction (the X-axis direction).

In the semiconductor device 120, the semiconductor member 10 may further include the first partial region 11a, the second partial region 11b, a third partial region 12c, and a fourth partial region 12d. For example, these partial regions function as drift regions.

The first partial region 11a is between the first electrode 51 and the first region 11 in the first direction (the Z-axis direction). The direction from the first partial region 11a toward the second partial region 11b is aligned with the second direction (e.g., the X-axis direction). The second partial region 11b is between the first electrode 51 and the third electrode 53 in the first direction.

The third partial region 12c is between the first electrode 51 and the second region 12 in the first direction (the Z-axis direction). The direction from the third partial region 12c toward the fourth partial region 12d is aligned with the second direction (e.g., the X-axis direction). The fourth partial region 12d is between the first electrode 51 and the fifth electrode 55 in the first direction.

For example, the current path spreads because the second partial region 11b and the fourth partial region 12d are provided. The ON-resistance can be reduced further thereby.

In one example of the semiconductor device 120, the semiconductor member 10 may further include a third region 13. The third region 13 is between the third electrode 53 and the second region 12 in the second direction (the X-axis direction). The impurity concentration in the third region 13 is higher than the impurity concentration in the second region 12. The impurity concentration in the third region 13 is higher than the impurity concentration in the first region 11.

For example, the first region 11 and the second region 12 are p-type regions. The third region 13 is a p$^+$-region. For example, the third region 13 may contact the third electrode 53. The third region 13 may function as a contact region of the third electrode 53.

In the semiconductor device 120, the semiconductor member 10 may further include a fourth region 14. For example, the fifth electrode 55 is positioned between the second region 12 and the fourth region 14 in the second direction (the X-axis direction). The fourth region 14 is a p$^+$-region. For example, the fourth region 14 may contact the fifth electrode 55. The fourth region 14 may function as a contact region of the fifth electrode 55.

In the semiconductor device 120, the semiconductor member 10 may further include the substrate 10s. The substrate 10s is provided between the first electrode 51 and the first region 11 and between the first electrode 51 and the second region 12. The substrate 10s is provided between the first electrode 51 and the third region 13 and between the first electrode 51 and the fourth region 14. The substrate 10s is, for example, a SiC substrate. The substrate 10s includes, for example, 4H-SiC or 6H-SiC. The semiconductor member 10 includes, for example, 4H-SiC or 6H-SiC.

For example, multiple trenches are formed in the semiconductor member 10 including the substrate 10s; and crystal members and electrodes are provided inside the multiple trenches. For example, the first crystal member 21 is formed on the side surface of one trench. The third electrode 53 is formed in at least a portion of the remaining space of the trench. For example, the second crystal member 22 is formed on the side surface of another trench. The fifth electrode 55 is formed in at least a portion of the remaining space of the other trench.

For example, a portion of the third region 13 may be provided between the substrate 10s and the third electrode 53. For example, a portion of the fourth region 14 may be provided between the substrate 10s and the fifth electrode 55.

The semiconductor member 10 may further include the first to fourth portions p1 to p4. The first portion p1 is provided between the first region 11 and the second electrode 52 in the first direction (the Z-axis direction). The second portion p2 is provided between the first portion p1 and the second electrode 52 in the first direction. The third portion p3 is provided between the second region 12 and the fourth electrode 54 in the first direction (the Z-axis direction). The fourth portion p4 is provided between the third portion p3 and the fourth electrode 54 in the first direction.

The impurity concentration of the second portion p2 is higher than the impurity concentration of the first portion p1. The impurity concentration of the fourth portion p4 is higher than the impurity concentration of the third portion p3. The impurity concentration of the first portion p1 is, for example, lower than the impurity concentration in the first region 11. The impurity concentration of the third portion p3 is, for example, lower than the impurity concentration in the second region 12.

In one example, the first region 11 and the second region 12 are of the p-type. For example, the second portion p2 and the fourth portion p4 are of the $n^+$-type. For example, the third region 13 and the fourth region 14 are of the $p^+$-type. For example, the substrate 10s is of the $n^+$-type.

The first to fourth insulating members 41 to 44 may be provided in the semiconductor device 120. The first insulating member 41 is provided between the second partial region 11b and the third electrode 53. In the example, the first insulating member 41 is provided between the third electrode 53 and a portion of the third region 13 in the first direction (the Z-axis direction).

The second insulating member 42 is provided between the third electrode 53 and a portion of the second electrode 52 in the first direction (the Z-axis direction). The second insulating member 42 electrically insulates the second electrode 52 and the third electrode 53. The second insulating member 42 electrically insulates the second electrode 52 and the third region 13.

The third insulating member 43 is provided between the fourth partial region 12d and the fifth electrode 55. In the example, the third insulating member 43 is provided between the fifth electrode 55 and a portion of the fourth region 14 in the first direction (the Z-axis direction).

The fourth insulating member 44 is provided between the fifth electrode 55 and a portion of the fourth electrode 54 in the first direction (the Z-axis direction). The fourth insulating member 44 electrically insulates the fourth electrode 54 and the fifth electrode 55. The fourth insulating member 44 electrically insulates the fourth electrode 54 and the fourth region 14.

Figure 7:
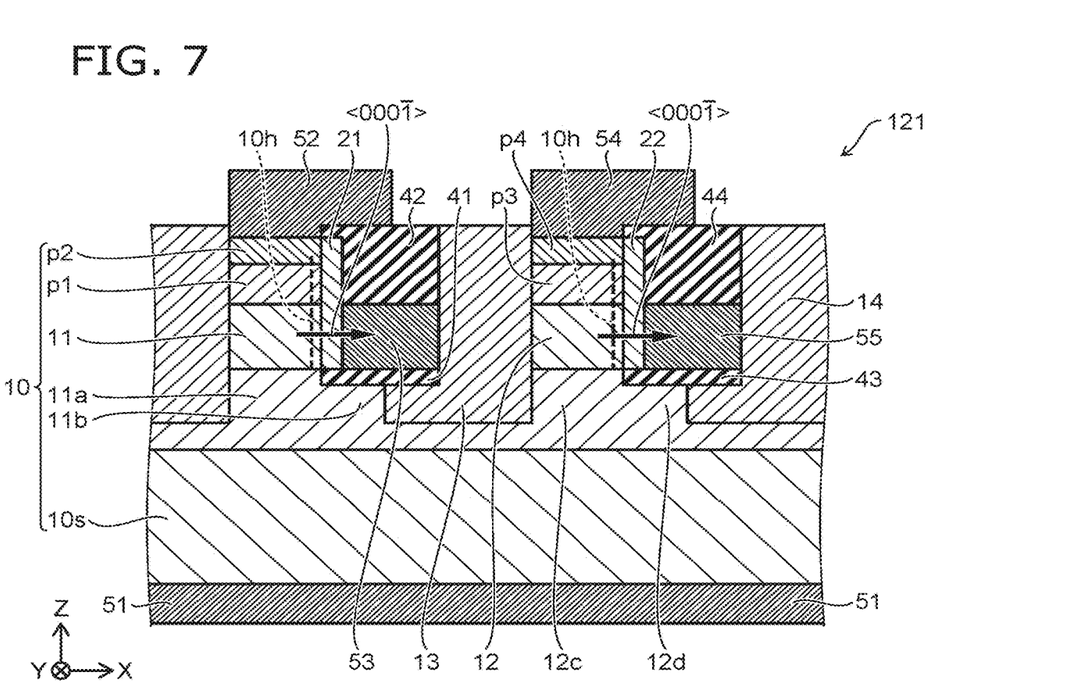
FIG. 7 is a schematic cross-sectional view illustrating a semiconductor device according to the second embodiment.

FIG. 7 is a schematic cross-sectional view illustrating a semiconductor device according to the second embodiment.

Portions of the semiconductor device 121 according to the embodiment that are different from the semiconductor device 120 will now be described. In the semiconductor device 121 as well, the first crystal member 21 has a wurtzite structure. In the semiconductor device 121, the <000-1> direction of the first crystal member 21 has a component in the orientation from the first region 11 toward the third electrode 53. The <000-1> direction of the second crystal member 22 has a component in the orientation from the second region 12 toward the fifth electrode 55. In such a case, the two-dimensional hole gas 10h is generated as a carrier region in the region of the semiconductor member 10 at the vicinity of the third electrode 53 and the region of the semiconductor member 10 at the vicinity of the fifth electrode 55. In the semiconductor device 121 as well, the ON-resistance can be reduced. In the semiconductor device 121, the ON-resistance can be reduced further by providing the second partial region 11b and the fourth partial region 12d. A semiconductor device can be provided in which the characteristics can be improved.

In one example of the semiconductor device 121, the first region 11 and the second region 12 are of the n-type. For example, the second portion p2 and the fourth portion p4 are of the $p^+$-type. For example, the third region 13 and the fourth region 14 are of the $n^+$-type. For example, the substrate 10s is of the $p^+$-type.

In the semiconductor device 121, the first crystal member 21 and the second crystal member 22 may have crystal structures having polarizations other than a wurtzite structure. In such a case, the orientation from negative to positive of the polarization for the first crystal member 21 and the second crystal member 22 or the orientation from positive to negative of the polarization for the first crystal member 21 and the second crystal member 22 may be aligned with the second direction (the X-axis direction).

An example of the characteristics of the semiconductor device 120 will now be described. As shown in FIG. 6, the distance along the X-axis direction between the boundary between the first region 11 and the first crystal member 21 and the boundary between the second partial region 11b and the third region 13 is taken as a distance dx. An example of simulation results will now be described for the characteristics of the semiconductor device 120 illustrated in FIG. 6 when changing the distance dx.

Figure 8:
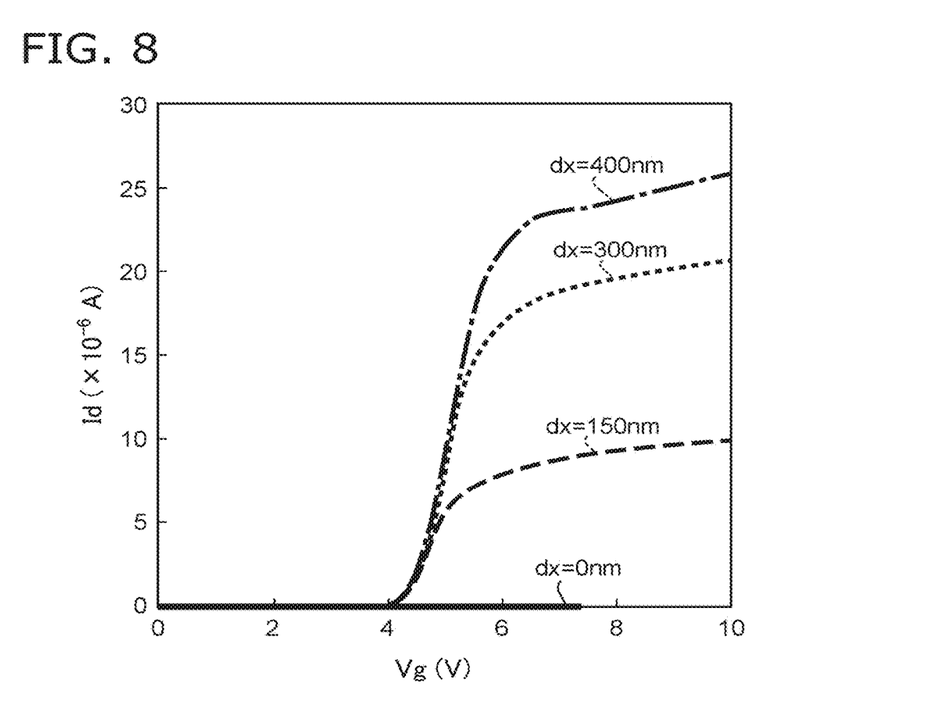
FIG. 8 is a graph illustrating the characteristics of the semiconductor device according to the second embodiment.

FIG. 8 is a graph illustrating the characteristics of the semiconductor device according to the second embodiment.

The horizontal axis of FIG. 8 is a gate voltage Vg (V). The gate voltage Vg corresponds to the potential of the third electrode 53 (the gate electrode) when referenced to the second electrode 52 (the source electrode). The vertical axis of FIG. 8 is a drain current Id ($\times 10^{-6}$ A). FIG. 8 illustrates the results when the distance dx is 0 nm, 150 nm, 300 nm, or 400 nm. In the example, the length in the X-axis direction of the third electrode 53 is 800 nm. It can be seen from FIG. 8 that for the same gate voltage Vg, the drain current Id increases as the distance dx lengthens.

An example of the simulation results of the characteristics of the semiconductor device 120 illustrated in FIG. 6 when changing the impurity concentration in the first region 11 (e.g., the p-type region) will now be described.

Figure 9:
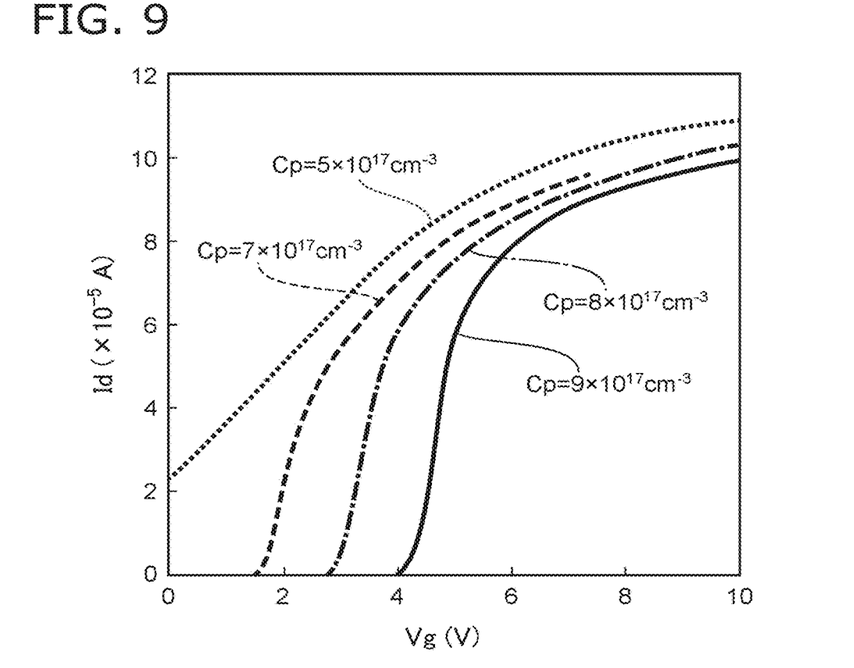
FIG. 9 is a graph illustrating characteristics of the semiconductor device according to the second embodiment.

FIG. 9 is a graph illustrating characteristics of the semiconductor device according to the second embodiment.

The horizontal axis of FIG. 9 is the gate voltage Vg (V). The vertical axis of FIG. 9 is the drain current Id ($\times 10^{-5}$ A). FIG. 9 illustrates the characteristics when a p-type impurity concentration Cp in the first region 11 is $5 \times 10^{17}$ cm$^{-3}$, $7 \times 10^{17}$ cm$^{-3}$, $8 \times 10^{17}$ cm$^{-3}$, or $9 \times 10^{17}$ cm$^{-3}$. It can be seen from FIG. 9 that the drain current Id is large when the gate voltage Vg is 0 V for a low impurity concentration. The threshold voltage can be controlled by controlling the impurity concentration in the first region 11. In one example of the semiconductor device 120, it is favorable for the p-type impurity concentration Cp in the first region 11 to be $7 \times 10^{17}$ cm$^{-3}$ or more. Thereby, for example, the OFF-current can be small. Stable normally-OFF characteristics are obtained.

Figure 10:
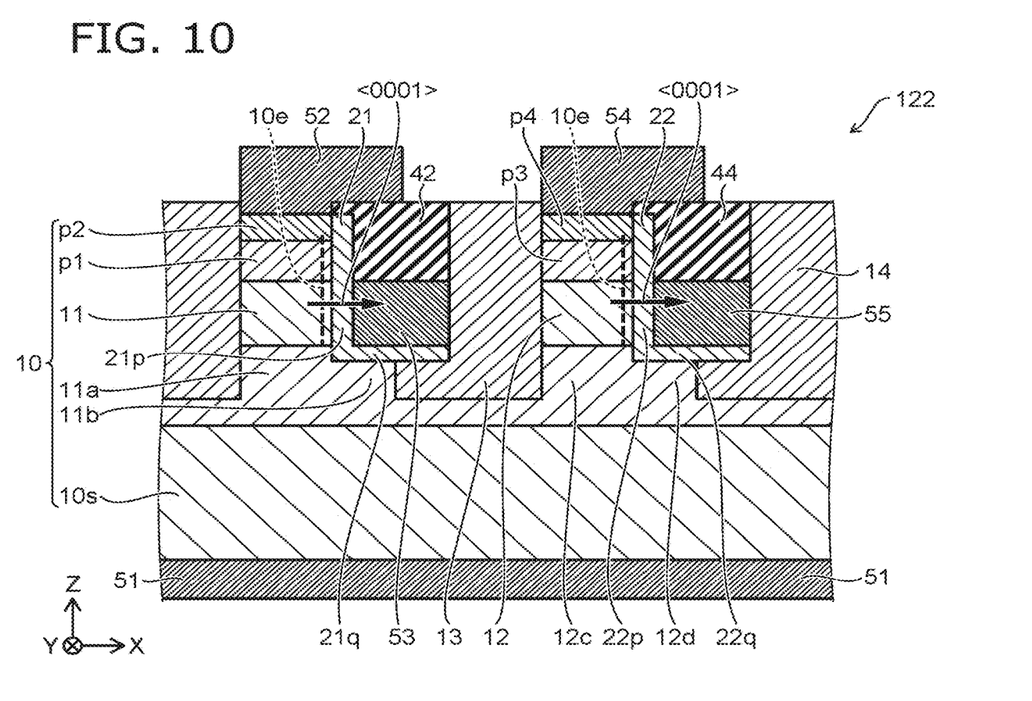
FIG. 10 is a schematic cross-sectional view illustrating a semiconductor device according to the second embodiment.

FIG. 10 is a schematic cross-sectional view illustrating a semiconductor device according to the second embodiment.

Portions of the semiconductor device 122 according to the embodiment that are different from the semiconductor device 120 will now be described. The first insulating member 41 and the third insulating member 43 are not provided in the semiconductor device 122.

In the semiconductor device 122, the first crystal member 21 includes the region 21p and the region 21q. The region 21p is between the first region 11 and the third electrode 53 in the second direction (the X-axis direction). The region 21q is between the second partial region 11b and the third electrode 53 in the first direction (the Z-axis direction). The region 21q electrically insulates the second partial region 11b and the third electrode 53.

In the semiconductor device 122, the second crystal member 22 includes a region 22p and a region 22q. The region 22p is between the second region 12 and the fifth electrode 55 in the second direction (the X-axis direction). The region 22q is between the fourth partial region 12d and the fifth electrode 55 in the first direction (the Z-axis direction). The region 22q electrically insulates the fourth partial region 12d and the fifth electrode 55.

Figure 11:
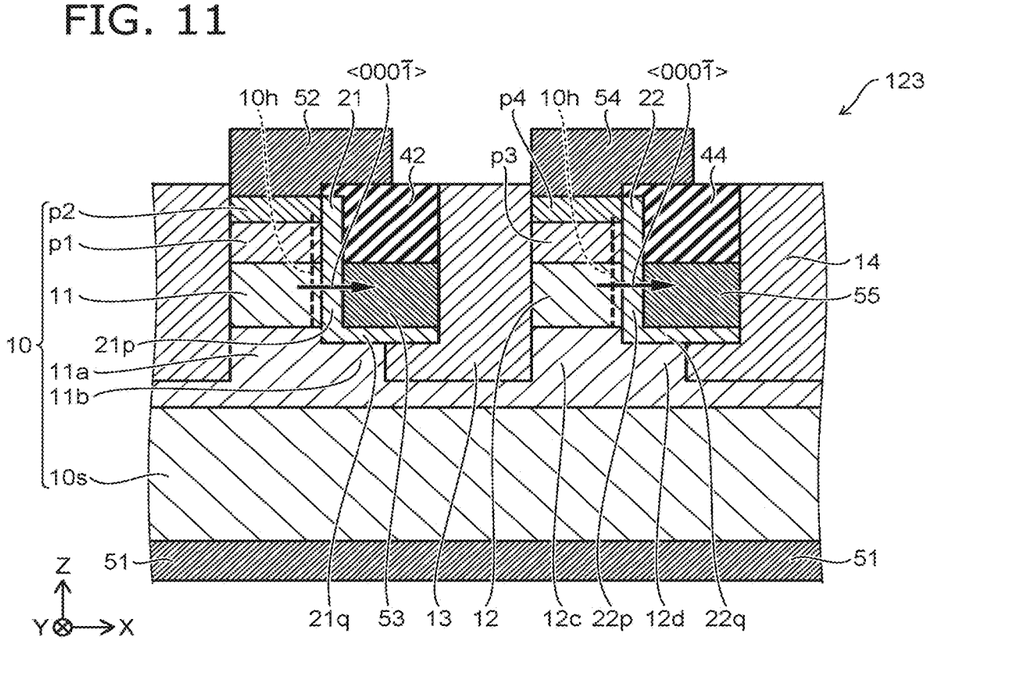
FIG. 11 is a schematic cross-sectional view illustrating a semiconductor device according to the second embodiment.

FIG. 11 is a schematic cross-sectional view illustrating a semiconductor device according to the second embodiment.

Portions of the semiconductor device 123 according to the embodiment that are different from the semiconductor device 121 will now be described. In the semiconductor device 123 as well, the first insulating member 41 and the third insulating member 43 are not provided. In the semiconductor device 122, the first crystal member 21 includes the region 21p and the region 21q. The second crystal member 22 includes the region 22p and the region 22q.

In the semiconductor devices 122 and 123 as well, the ON-resistance can be reduced. A semiconductor device can be provided in which the characteristics can be improved.

Third Embodiment

Figure 12:
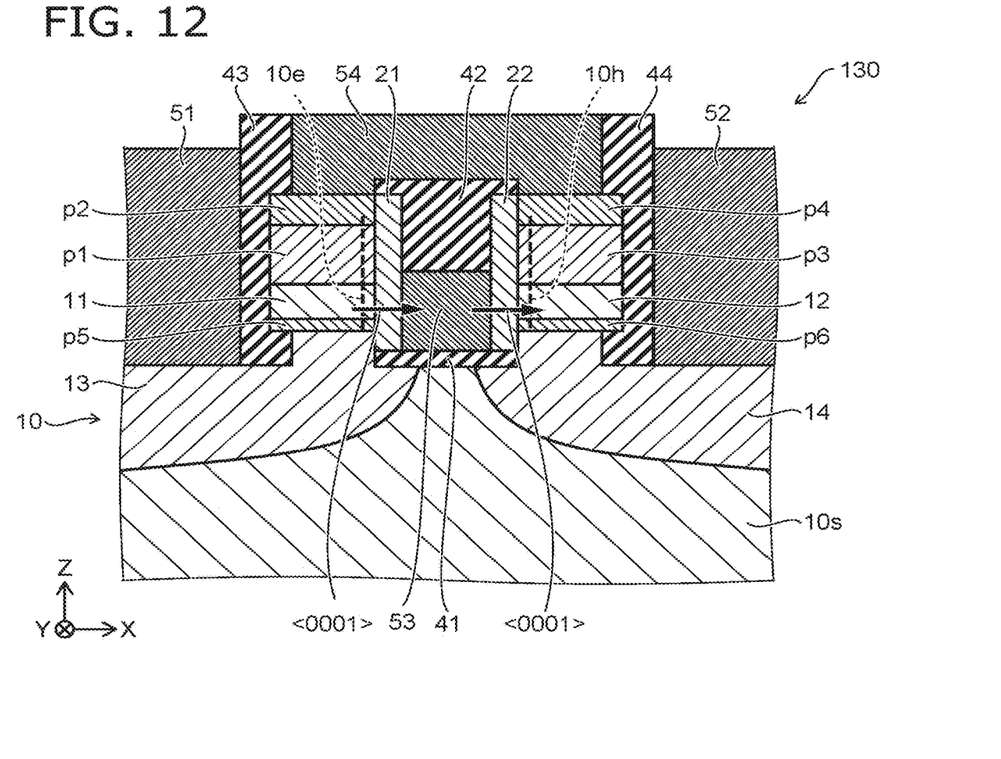
FIG. 12 is a schematic cross-sectional view illustrating a semiconductor device according to a third embodiment.

FIG. 12 is a schematic cross-sectional view illustrating a semiconductor device according to a third embodiment.

As shown in FIG. 12, the semiconductor device 130 according to the third embodiment includes the first electrode 51, the second electrode 52, the third electrode 53, the fourth electrode 54, the semiconductor member 10, the first crystal member 21, and the second crystal member 22.

The first direction from the third electrode 53 toward the fourth electrode 54 crosses the second direction from the first electrode 51 toward the second electrode 52.

The first direction is taken as the Z-axis direction. The second direction is, for example, the X-axis direction.

The position in the second direction (the X-axis direction) of the third electrode 53 is between the position in the second direction of the first electrode 51 and the position in the second direction of the second electrode 52. For example, the third electrode 53 is between the first electrode 51 and the second electrode 52 in the X-axis direction.

The position in the second direction (the X-axis direction) of the fourth electrode 54 is between the position in the second direction of the first electrode 51 and the position in the second direction of the second electrode 52. For example, the fourth electrode 54 is provided above the third electrode 53.

The semiconductor member 10 includes at least one selected from the group consisting of silicon carbide, silicon, carbon, and germanium.

The substrate 10s is provided in the example. The semiconductor member 10 and the first to fourth electrodes 51 to 54 are provided on the substrate 10s. The substrate 10s is, for example, a SiC substrate. The substrate 10s includes, for example, 4H-SiC or 6H-SiC. The semiconductor member 10 includes, for example, 4H-SiC or 6H-SiC.

The semiconductor member 10 includes the first region 11 and the second region 12. The first region 11 is between the first electrode 51 and the third electrode 53 in the second direction (the X-axis direction). The second region 12 is between the third electrode 53 and the second electrode 52 in the second direction. The first region 11 and the second region 12 are electrically connected to the fourth electrode 54.

The first crystal member 21 is provided between the first region 11 and the third electrode 53 in the second direction (the X-axis direction). The second crystal member 22 is provided between the second region 12 and the third electrode 53 in the second direction.

For example, the first crystal member 21 and the second crystal member 22 have wurtzite structures. The <0001> direction of the first crystal member 21 has a component in the orientation from the first region 11 toward the third electrode 53. The <0001> direction of the second crystal member 22 has a component in the orientation from the third electrode 53 toward the second region 12.

For example, the two-dimensional electron gas 10e is formed in the region of the first region 11 at the vicinity of the first crystal member 21. For example, the two-dimensional hole gas 10h is formed in the region of the second region 12 at the vicinity of the second crystal member 22.

For example, the potential of the first electrode 51 is set to a low potential. The potential of the second electrode 52 is set to a high potential. The high potential is higher than the low potential recited above. An input signal is input to the third electrode 53. The resistance state between the first electrode 51 and the fourth electrode 54 and the resistance state between the second electrode 52 and the fourth electrode 54 are controlled according to the input signal. Thereby, a signal that corresponds to the input signal is output from the fourth electrode 54. For example, the semiconductor device 130 functions as a CMOS (Complementary metal-oxide-semiconductor) element. For example, high-speed switching characteristics are obtained in the semiconductor device 130. For example, the power consumption can be reduced. A semiconductor device can be provided in which the characteristics can be improved.

In the example, the semiconductor member 10 further includes the first to fourth portions p1 to p4. The first portion p1 is provided between the first region 11 and the fourth electrode 54 in the first direction (the Z-axis direction). The second portion p2 is provided between the first portion p1 and the fourth electrode 54 in the first direction. The third portion p3 is provided between the second region 12 and the fourth electrode 54 in the first direction (the Z-axis direction). The fourth portion p4 is provided between the third portion p3 and the fourth electrode 54 in the first direction.

The impurity concentration of the second portion p2 is higher than the impurity concentration of the first portion p1. The impurity concentration of the fourth portion p4 is higher than the impurity concentration of the third portion p3. The impurity concentration of the first portion p1 is, for example, lower than the impurity concentration in the first region 11. The impurity concentration of the third portion p3 is, for example, lower than the impurity concentration in the second region 12.

The second portion p2 and the fourth portion p4 function as contact regions with the fourth electrode 54.

The semiconductor member 10 further includes the third region 13 and the fourth region 14. In the example, a region where the impurity concentration is high is provided in a portion of the substrate 10s. The region where the impurity concentration is high corresponds to the third region 13 and the fourth region 14. For example, the direction from a portion of the third region 13 toward the first electrode 51 is aligned with the first direction (the Z-axis direction). For example, the direction from a portion of the fourth region 14 toward the second electrode 52 is aligned with the first direction (the Z-axis direction). The third region 13 is used as a current path between the first electrode 51 and the first region 11. The fourth region 14 is used as a second electrode 52 and the current path between the second region 12.

In the example, the semiconductor member 10 further includes a fifth portion p5 and a sixth portion p6. The fifth portion p5 is between the first region 11 and another portion of the third region 13 in the first direction (the Z-axis direction). The sixth portion p6 is between the second region 12 and another portion of the fourth region 14 in the first direction (the Z-axis direction).

The third region 13 is, for example, an n$^+$-region. The fourth region 14 is, for example, a p$^+$-region. The first region 11 is, for example, a p-type region. The second region 12 is, for example, an n-type region. The second portion p2 is, for example, an n$^+$-type region. The fourth portion p4 is a p$^+$-type region.

The first to fourth insulating members 41 to 44 are provided in the example. The first insulating member 41 is provided between the third electrode 53 and the substrate 10s (including the third region 13 and the fourth region 14). The second insulating member 42 is provided between the third electrode 53 and the fourth electrode 54, between the first crystal member 21 and the fourth electrode 54, and between the second crystal member 22 and the fourth electrode 54.

In the second direction (the X-axis direction), the third insulating member 43 is provided between the first electrode 51 and the first region 11, between the first electrode 51 and the first portion p1, between the first electrode 51 and the second portion p2, and between the first electrode 51 and the fifth portion p5.

In the second direction (the X-axis direction), the fourth insulating member 44 is provided between the second electrode 52 and the second region 12, between the second electrode 52 and the third portion p3, between the second electrode 52 and the fourth portion p4, and between the second electrode 52 and the sixth portion p6.

In the semiconductor device 130, the first crystal member 21 and the second crystal member 22 may have crystal structures having polarizations other than a wurtzite structure. In such a case, the orientation from negative to positive of the polarization for the first crystal member 21 and the second crystal member 22 or the orientation from positive to negative of the polarization for the first crystal member 21 and the second crystal member 22 may be aligned with the second direction (the X-axis direction).

Figure 13:
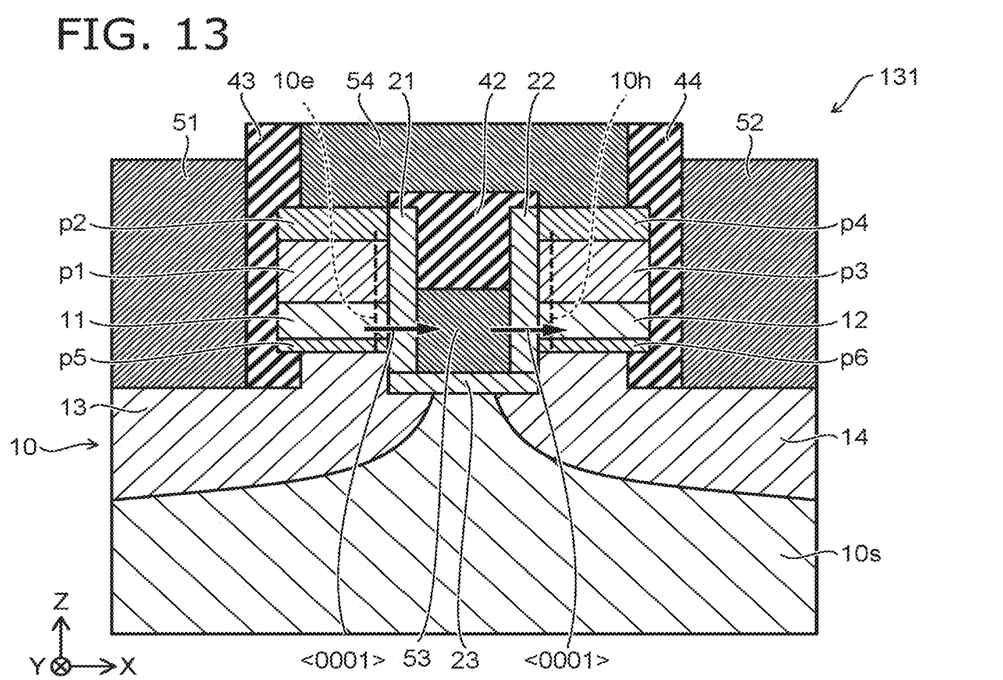
FIG. 13 is a schematic cross-sectional view illustrating a semiconductor device according to a third embodiment.

FIG. 13 is a schematic cross-sectional view illustrating a semiconductor device according to a third embodiment.

Portions of the semiconductor device 131 according to the embodiment that are different from the semiconductor device 130 will now be described. The first insulating member 41 is not provided in the semiconductor device 131. In addition to the first crystal member 21 and the second crystal member 22, the semiconductor device 131 further includes a third crystal member 23.

The third electrode 53 is provided between the third crystal member 23 and the fourth electrode 54 in the first direction (the Z-axis direction). In the case where the second insulating member 42 is provided, the third electrode 53 is provided between the third crystal member 23 and the second insulating member 42 in the first direction (the Z-axis direction).

The third crystal member 23 may include the same material as the first crystal member 21. The third crystal member 23 may include the same material as the second crystal member 22. The third crystal member 23 may be continuous with the first crystal member 21 and the second crystal member 22. For example, the third crystal member 23 electrically insulates the third electrode 53 and the substrate 10s (including the third region 13 and the fourth region 14). For example, the first to third crystal members 21 to 23 are insulative.

For example, the semiconductor device 131 also functions as a CMOS element. For example, high-speed switching characteristics are obtained in the semiconductor device 131. For example, the power consumption can be reduced. A semiconductor device can be provided in which the characteristics can be improved.

In the embodiments recited above, the electrodes (e.g., at least one of the first to fifth electrodes 51 to 55) include, for example, at least one selected from the group consisting of Al, Ti, Ni, and Au.

In the embodiments recited above, the semiconductor member 10 includes, for example, SiC. In such a case, good heat dissipation is obtained compared to the case where the semiconductor member 10 includes silicon.

It is favorable for the crystal member (the first crystal member 21 and the second crystal member 22) to include AlN. A high breakdown voltage is obtained thereby.

It is favorable for the semiconductor member 10 to include SiC and the crystal member to include AlN. The lattice constant difference is small between these materials. For example, good crystallinity is obtained in AlN (the crystal member).

The potential difference is large between these materials when the semiconductor member 10 includes SiC and the crystal member includes AlN. Carriers are easily confined and localized thereby. For example, the integrated concentration of the carriers can be increased.

In the embodiments recited above, for example, the crystal member is formed by at least one selected from the group consisting of MOCVD (metal-organic chemical vapor deposition), molecular beam epitaxy (MBE), hydride vapor phase epitaxy (HVPE), sputtering, and pulsed laser deposition.

According to the embodiments, a semiconductor device can be provided in which the characteristics can be improved.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor members, crystal members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first electrode;
    a second electrode, a direction from the first electrode toward the second electrode being aligned with a first direction;
    a third electrode, a position in the first direction of the third electrode being between a position in the first direction of the first electrode and a position in the first direction of the second electrode;
    a semiconductor member including at least one selected from the group consisting of silicon carbide, silicon, carbon, and germanium, the semiconductor member including a first region, a first partial region, and a second partial region, the first region being between the first electrode and the second electrode in the first direction, a second direction from the first region toward the third electrode crossing the first direction, the first partial region being between the first electrode and the first region in the first direction, a direction from the first partial region toward the second partial region being aligned with the second direction, the second partial region being between the first electrode and the third electrode in the first direction; and
    a first crystal member provided between the first region and the third electrode in the second direction.

2. The device according to claim 1, wherein
    the first crystal member has a wurtzite structure, and
    a <0001> direction or a <000-1> direction of the first crystal member is aligned with the second direction.

3. The device according to claim 2, wherein the first crystal member includes $Al_xGa_{1-x}N$ ($0<x\leq1$).

4. The device according to claim 1, wherein an orientation from negative to positive of a polarization of the first crystal member or an orientation from positive to negative of the polarization is aligned with the second direction.

5. The device according to claim 1, wherein the semiconductor member further includes a substrate provided between the first electrode and the first partial region and between the first electrode and the second partial region.

6. The device according to claim 1, wherein
    the first crystal member has a wurtzite structure,
    a <0001> direction of the first crystal member has a component in an orientation from the first region toward the third electrode, and
    the first region is of a p-type.

7. The device according to claim 1, wherein
    the first crystal member has a wurtzite structure,
    a <000-1> direction of the first crystal member has a component in an orientation from the first region toward the third electrode, and
    the first region is of an n-type.

8. The device according to claim 1, wherein
    the semiconductor member further includes:
        a first portion provided between the first region and the second electrode in the first direction; and
        a second portion provided between the first portion and the second electrode in the first direction, and
    an impurity concentration of the second portion is higher than an impurity concentration of the first portion.

9. The device according to claim 1, further comprising a first insulating member provided between the second partial region and the third electrode.

10. The device according to claim 1, wherein the first crystal member includes a region between the second partial region and the third electrode in the first direction.

11. The device according to claim 1, further comprising a second insulating member provided between the third electrode and a portion of the second electrode in the first direction.

12. A semiconductor device, comprising:
    a first electrode;
    a second electrode, a direction from the first electrode toward the second electrode being aligned with a first direction;
    a third electrode, a position in the first direction of the third electrode being between a position in the first direction of the first electrode and a position in the first direction of the second electrode;

a fourth electrode, a direction from the first electrode toward the fourth electrode being aligned with the first direction, a direction from the second electrode toward the fourth electrode being aligned with a second direction crossing the first direction;

a fifth electrode, a position in the first direction of the fifth electrode being between the position in the first direction of the first electrode and a position in the first direction of the fourth electrode, a direction from the third electrode toward the fifth electrode being aligned with the second direction;

a semiconductor member including at least one selected from the group consisting of silicon carbide, silicon, carbon, and germanium, the semiconductor member including a first region and a second region, the first region being between the first electrode and the second electrode in the first direction, the second region being between the first electrode and the fourth electrode in the first direction;

a first crystal member provided between the first region and the third electrode in the second direction; and a second crystal member provided between the second region and the fifth electrode in the second direction.

13. The device according to claim 12, wherein the semiconductor member further includes a substrate provided between the first electrode and the first region and between the first electrode and the second region.

14. The device according to claim 12, wherein
the semiconductor member further includes a first partial region, a second partial region, a third partial region, and a fourth partial region,
the first partial region is between the first electrode and the first region in the first direction,
a direction from the first partial region toward the second partial region is aligned with the second direction,
the second partial region is between the first electrode and the third electrode in the first direction,
the third partial region is between the first electrode and the second region in the first direction,
a direction from the third partial region toward the fourth partial region is aligned with the second direction; and
the fourth partial region is between the first electrode and the fifth electrode in the first direction.

15. The device according to claim 12, wherein
the semiconductor member further includes a third region,
the third region is between the third electrode and the second region in the second direction, and
an impurity concentration in the third region is higher than an impurity concentration in the second region.

16. The device according to claim 12, wherein
the first crystal member and the second crystal member have wurtzite structures,
a <0001> direction or a <000-1> direction of the first crystal member is aligned with the second direction, and
a <0001> direction or a <000-1> direction of the second crystal member is aligned with the second direction.

17. The device according to claim 12, wherein
the first crystal member and the second crystal member have wurtzite structures,
a <0001> direction of the first crystal member has a component in an orientation from the first region toward the third electrode,
a <0001> direction of the second crystal member has a component in an orientation from the second region toward the fifth electrode, and
the first region and the second region are of a p-type.

18. The device according to claim 12, wherein
the first crystal member and the second crystal member have wurtzite structures,
a <000-1> direction of the first crystal member has a component in an orientation from the first region toward the third electrode,
a <000-1> direction of the second crystal member has a component in an orientation from the second region toward the fifth electrode, and
the first region and the second region are of an n-type.

19. A semiconductor device, comprising:
a first electrode;
a second electrode;
a third electrode;
a fourth electrode, a first direction from the third electrode toward the fourth electrode crossing a second direction from the first electrode toward the second electrode, a position in the second direction of the third electrode being between a position in the second direction of the first electrode and a position in the second direction of the second electrode;
a semiconductor member including at least one selected from the group consisting of silicon carbide, silicon, carbon, and germanium, the semiconductor member including a first region and a second region, the first region being between the first electrode and the third electrode in the second direction, the second region being between the third electrode and the second electrode in the second direction, the first region and the second region being electrically connected to the fourth electrode;
a first crystal member provided between the first region and the third electrode in the second direction; and
a second crystal member provided between the second region and the third electrode in the second direction.

20. The device according to claim 19, wherein
the first crystal member and the second crystal member have wurtzite structures,
a <0001> direction of the first crystal member has a component in an orientation from the first region toward the third electrode, and
a <0001> direction of the second crystal member has a component in an orientation from the third electrode toward the second region.

* * * * *